United States Patent
Ai

(10) Patent No.: US 10,048,542 B2
(45) Date of Patent: Aug. 14, 2018

(54) ARRAY SUBSTRATE AND METHOD OF MANUFACTURING THE SAME, DISPLAY PANEL AND DISPLAY DEVICE

(71) Applicants: BOE Technology Group Co., LTD., Beijing (CN); HEFEI Xinsheng Optoelectronics Technology Co., LTD., Hefei (CN)

(72) Inventor: Yu Ai, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 120 days.

(21) Appl. No.: 14/769,072

(22) PCT Filed: Mar. 26, 2015

(86) PCT No.: PCT/CN2015/075113
§ 371 (c)(1),
(2) Date: Aug. 19, 2015

(87) PCT Pub. No.: WO2016/065829
PCT Pub. Date: May 6, 2016

(65) Prior Publication Data
US 2016/0252763 A1    Sep. 1, 2016

(30) Foreign Application Priority Data
Oct. 28, 2014   (CN) .......................... 2014 1 0592096

(51) Int. Cl.
*G02F 1/1339*   (2006.01)
*G02F 1/1368*   (2006.01)
(Continued)

(52) U.S. Cl.
CPC .......... *G02F 1/1339* (2013.01); *G02F 1/1345* (2013.01); *G02F 1/1368* (2013.01);
(Continued)

(58) Field of Classification Search
CPC ...................................................... G02F 1/1339
See application file for complete search history.

(56) References Cited

U.S. PATENT DOCUMENTS

2008/0123042 A1* 5/2008 Tashiro ................. G02F 1/1303
349/153
2009/0323001 A1* 12/2009 Kwon ................... G02F 1/1339
349/139
(Continued)

FOREIGN PATENT DOCUMENTS

| CN | 101825817 A | 9/2010 |
|---|---|---|
| CN | 201698133 U | 1/2011 |

(Continued)

OTHER PUBLICATIONS

The International Search Report dated Mar. 26, 2015 for International Application No. PCT/CN2015/075113.
(Continued)

*Primary Examiner* — Edmond Lau
(74) *Attorney, Agent, or Firm* — Kinney & Lange, P.A.

(57) ABSTRACT

There are provided an array substrate and a method of manufacturing the same, a display panel and a display device. The array substrate includes a substrate and and an array region and a peripheral wire region formed on the substrate, peripheral wires in the peripheral wire region each including a plurality of vacancy patterns. Adjacent edges of the non-vacancy patterns of the peripheral wires define shielding regions such that the maximum circle region contained in the shielding regions has a maximum diameter of a first threshold value. The vacancy patterns of each of the
(Continued)

peripheral wires have a total area of a second threshold value. The resistivity of the peripheral wire is in a range from 0 to $2.83 \times 10^{-8}$ Ω·m. The embodiments of the present disclosure address problem in prior art that a peripheral wire blocks curing of the frame sealing glue in the display panel so that the frame sealing glue is cured insufficiently and throughout of the display panel is thus degraded.

8 Claims, 5 Drawing Sheets

(51) Int. Cl.
  *H01L 23/528* (2006.01)
  *H01L 23/532* (2006.01)
  *H01L 27/12* (2006.01)
  *H01L 29/786* (2006.01)
  *G02F 1/1345* (2006.01)
  *G02F 1/1335* (2006.01)

(52) U.S. Cl.
  CPC ...... *G02F 1/133514* (2013.01); *H01L 23/528* (2013.01); *H01L 23/53228* (2013.01); *H01L 23/53242* (2013.01); *H01L 27/124* (2013.01); *H01L 27/1259* (2013.01); *H01L 29/78633* (2013.01); *G02F 1/133512* (2013.01); *G02F 2202/28* (2013.01)

(56) References Cited

U.S. PATENT DOCUMENTS

| | | | | |
|---|---|---|---|---|
| 2010/0066232 | A1* | 3/2010 | Kim | H01L 51/5246 313/317 |
| 2012/0200799 | A1* | 8/2012 | Miyamoto | G02F 1/13394 349/58 |
| 2013/0069149 | A1* | 3/2013 | Masuoka | H01L 21/84 257/330 |
| 2014/0349423 | A1* | 11/2014 | Lo | G02F 1/1339 438/27 |

FOREIGN PATENT DOCUMENTS

| | | |
|---|---|---|
| CN | 202433650 U | 9/2012 |
| CN | 102854663 A | 1/2013 |
| CN | 103268049 A | 8/2013 |
| CN | 203133452 U | 8/2013 |
| CN | 103296491 A | 9/2013 |
| CN | 104298016 A | 1/2015 |
| JP | H1212069 A | 8/1999 |
| JP | 2008233729 A | 10/2008 |
| KR | 20140096601 A | 8/2014 |

OTHER PUBLICATIONS

First Chinese Office Action dated Aug. 3, 2016, for corresponding Chinese Application No. 201410592096.5.
Second Chinese Office Action dated Jan. 13, 2017 for corresponding Chinese Application No. 201410592096.5.
Chinese Rejection Decision, for Chinese Patent Application No. 201510592096.5, dated Jun. 14, 2017, 12 pages.

* cited by examiner

ARRAY SUBSTRATE AND METHOD OF MANUFACTURING THE SAME, DISPLAY PANEL AND DISPLAY DEVICE

BACKGROUND OF THE INVENTION

Field of the Invention

The present disclosure relates to the field of liquid crystal display, and particularly to array substrate and method of manufacturing the same, display panel and display device.

Description of the Related Art

It is a development trend to provide a display panel with a narrower frame side. In a celling process during manufacturing a display panel, a frame sealing glue is provided between a color film substrate and an array substrate, and is then cured to bond them together. On the color film substrate is further provided a black matrix, which completely shields the frame sealing glue and blocks ultraviolet light off. Thus, i the ultraviolet light is usually used to irradiate the frame sealing glue from a side of the array substrate so as to cure the frame sealing glue, thereby bonding the the color film substrate and the array substrate together.

However, since the metal wire of the peripheral wires of the array substrate is rather wide in prior art, it may shield the frame sealing glue. Thus, when irradiating the frame sealing glue from a side of the array substrate by the ultraviolet light, the ultraviolet light may not traverse or completely traverse the metal wire, and thus may not cure the frame sealing glue completely. In this instance, the uncured frame sealing glue in liquid may flow around, leading to defects in the display panel.

SUMMARY OF THE INVENTION

It is an object of the present disclosure to provide an array substrate and a method of manufacturing the same, a display panel and a display device, to address at least one problem in prior art, i.e., a peripheral wire impedes solidification of the frame sealing glue in the display panel so that the frame sealing glue is cured insufficiently, degrading throughout of the display panel.

According to an embodiment of the present invention, there is provided an array substrate comprising a substrate and an array region and a peripheral wire region formed on the substrate, peripheral wires in the peripheral wire region each including a plurality of vacancy patterns. Adjacent edges of the non-vacancy patterns of the peripheral wires define shielding regions such that the maximum circle region contained in the shielding regions has a maximum diameter of a first threshold value, and the vacancy patterns of each of the peripheral wires have a total area of a second threshold value. The peripheral wires have a resistance in a range from 0 to $2.83 \times 10^{-8}$ Ω·m.

In the embodiment of the present disclosure, the vacancy patterns of the peripheral wires allow an ultraviolet light to traverse and have a total area of the second threshold. The peripheral wires are configured such that the maximum circle region shielded by the non-vacancy patterns of the peripheral wires have the maximum diameter of the first threshold, such that the ultraviolet light traversing the vacancy patterns may completely cure the frame sealing glue which is shielded by the adjacent non-vacancy patterns of the peripheral wires, thereby fully curing the frame sealing glue which is shielded by the whole peripheral wires. The peripheral wires have a resistivity in a range from 0 to $2.83 \times 10^{-8}$ Ω·m in so that a resistance of the peripheral wire containing strip-liked rectangle vacancy patterns meets requirement for signal transmission.

Preferably, the first threshold is in range from 45 μm to 55 μm and the second threshold is 26%~50% of the area of the peripheral wires themselves where the vacancy patterns are located.

Preferably, the peripheral wires are made of copper or silver. In the embodiment of the present disclosure, copper or silver is used as material for manufacturing the peripheral wires, enabling the peripheral wires to have a resistance meeting requirement for signal transmission, even most of the wires had been removed.

Preferably, the vacancy patterns may be rectangle, triangle or trapezoid. Preferably, the vacancy patterns may be strip-like rectangle vacancy patterns, and each of the peripheral wires has the same extension direction as that of the vacancy patterns therein.

Preferably, the array region comprises thin film transistors and the peripheral wires are formed in a metal layer where gate electrodes of the thin film transistors are located. In an embodiment of the present disclosure, the peripheral wires and the gate electrodes are disposed in the same layer so as to simplify the process of manufacturing the array substrate.

According to an embodiment of the present disclosure, there is provided a display panel, comprising the array substrate according to the above embodiments.

Preferably, the display panel further includes a color film substrate and a frame sealing glue, in which the frame sealing glue is disposed between the color film substrate and the array substrate.

A part of the peripheral wire of the the array substrate is located corresponding to the frame sealing glue.

On a side of the color film substrate facing the array substrate is provided a black matrix which is located corresponding to the frame sealing glue, the black matrix completely shielding the frame sealing glue.

Preferably, the frame sealing glue has a width in a range of 0.8 mm to 1.2 mm.

According to an embodiment of the present disclosure, there is provided a display device, comprising the display panel according to the above embodiments.

According to an embodiment of the present disclosure, there is provided a method of manufacturing an array substrate, comprising the steps of:

providing a substrate;

forming a metal film on the substrate by using a metal material with a resistivity in a range of $0 \sim 2.83 \times 10^{-8}$ Ω·m and then, through a patterning process, forming gate electrodes of thin film transistors in the array region and the peripheral wires in the peripheral wire region, the peripheral wires in the peripheral wire region having a plurality of vacancy patterns. Adjacent edges of the non-vacancy patterns of the peripheral wires define shielding regions such that the maximum circle region contained in the shielding regions has a maximum diameter of a first threshold value, and the vacancy patterns of each of the peripheral wires have a total area of a second threshold value.

Preferably, the first threshold value is in a range of 45 to 55 μm, and the vacancy patterns of each of the peripheral wires have a total area of a second threshold value which is 26%~50% of an area of the peripheral wires themselves where the vacancy patterns are located.

DETAILED DESCRIPTION OF PREFERRED EMBODIMENTS OF THE INVENTION

Figure 1:
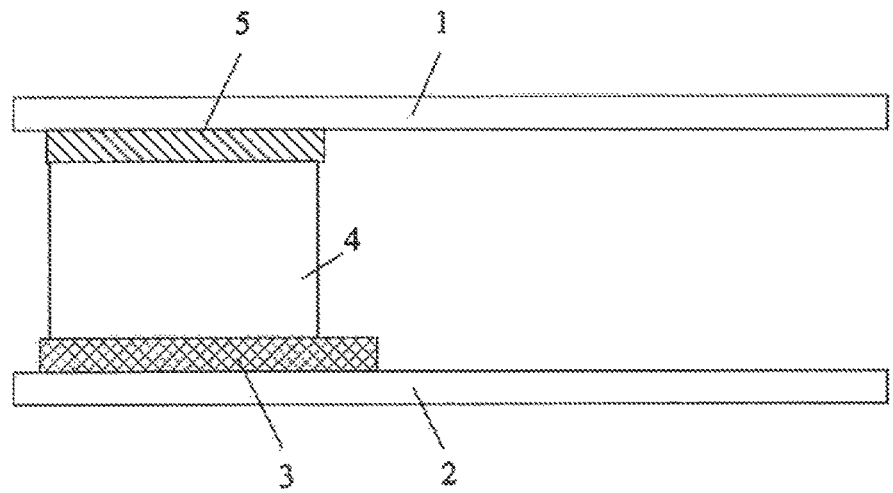
FIG. 1 is a schematic sectional view of a display panel prior art, prior to solidification of the frame sealing glue.

Exemplary embodiments of the present disclosure will be described hereinafter in detail with reference to the attached drawings. In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

There is provided an array substrate according to an embodiment of the present disclosure, comprising a substrate, and an array region and a peripheral wire region formed on the substrate. Peripheral wires in the peripheral wire region each include a plurality of vacancy patterns. The maximum circle region that is contained in a shielding region defined by adjacent edges of the non-vacancy pattern of the peripheral wires has a maximum diameter of a first threshold value. The vacancy patterns of each of the peripheral wires have a total area of a second threshold value and the peripheral wires have a resistance in a range from 0 to $2.83 \times 10^{-8}$ $\Omega \cdot m$. The vacancy pattern herein means part of the wire is removed and the other part of the wire is remained, thereby forming a vacancy pattern of the wire material in the peripheral wire region. The vacancy pattern may also be considered a pattern exhibited by a wire region including a non-material part embedded therein.

Figure 2:
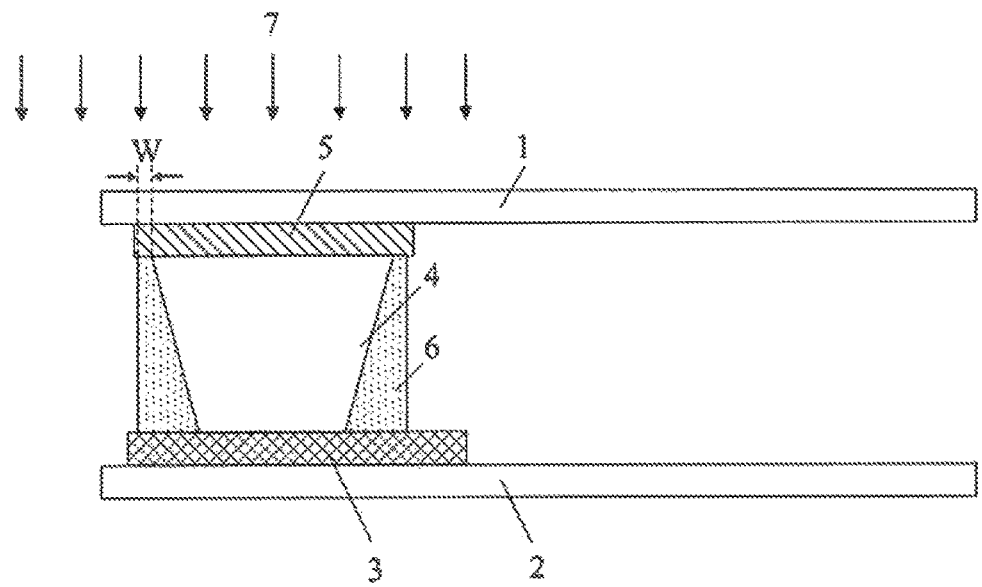
FIG. 2 is a schematic sectional view of a display panel in prior art, posterior to solidification of the frame sealing glue.

FIG. 1 shows a schematic view of a display panel prior to curing the frame sealing glue by an ultraviolet light during celling. The display panel includes an array substrate 1 and a color film substrate 2 that are arranged opposite to each other. A peripheral wire 5 is disposed on a side of the array substrate 1 that faces to the color film substrate 2 and a black matrix 3 is disposed on a side of the color film substrate 2 that faces to the array substrate 1. The array substrate 1 and the color substrate 2 are adhered together by a un-cured frame sealing glue 4, in which the black matrix completely shields the un-cured frame sealing glue 4 and the peripheral wire 5 also completely or partially shields the un-cured frame sealing glue 4. The celling in brief refers to a process of aligning and assembling an array substrate 1 and a color film substrate 2 during manufacturing a display panel. FIG. 2 illustrates a schematic view of a display posterior to curing the frame sealing glue during celling (in which the similar reference numbers refer to the same components in FIG. 1). Although the peripheral wire 5 blocks the ultraviolet light 7, part of the un-cured frame sealing glue 4 is still cured by the diffracted ultraviolet light, the cured part having a minimum width of W. That is, after having been cured by the ultraviolet light, a part of cured frame sealing glue 6 and a part of un-cured frame sealing glue 4 are formed.

An embodiment of the present disclosure is obtained by modifying the structure shown in FIGS. 1 and 2. In the embodiment of the present disclosure, the peripheral wires have vacancy patterns and thus the vacancy patterns of the peripheral wires permit the ultraviolet light to traverse the peripheral wires. Further, a circle region that the continuous non-vacancy pattern of the peripheral wire defines has a maximum diameter less than or equal to a first threshold such that the vacancy patterns allows the ultraviolet light to traverse it so as to completely cure the frame sealing glue that is shielded by the non-vacancy pattern of the peripheral wire, thereby completely curing the frame sealing glue shielded by the whole peripheral wire. According to the embodiment of the present disclosure, the peripheral wires have a resistivity less than or equal to that of aluminium such that a resistance of the peripheral wires in rectangle shape that include vacancy patterns may meets requirement for transmission of an electrical signal.

According to an embodiment of the present invention, adjacent edges of the non-vacancy patterns of the peripheral wires define shielding regions such that the maximum circle region contained in the shielding regions has a maximum diameter less than or equal to 55 μm so as to meet requirements for curing the frame sealing glue. In order to obtain the peripheral wires with desired resistance and strength, preferably, the first threshold may be determined in a range from 45 to 55 μm and the second threshold may be 26%~50% of the area of the own peripheral wire where the vacancy patterns are located. In the embodiment, a maximum circle region that the shielding region defined by the adjacent edges of the non-vacancy patterns of the peripheral wires can cover has a maximum diameter in a range from 45 to 55 μm. The total area of the vacancy patterns of each of the peripheral wires is 26%~50% of the area of the each of the peripheral wires, which ensures the ultraviolet light traversing the vacancy patterns completely cures the frame sealing glue that is shielded by the non-vacancy pattern.

Preferably, the peripheral wires are made by copper or silver. In an embodiment of the present disclosure, copper or silver, as a material for making the peripheral wire, allows a resistance of the peripheral wire may meet requirement for signal transmission, even thought most of the peripheral wire is removed.

Figure 3A:
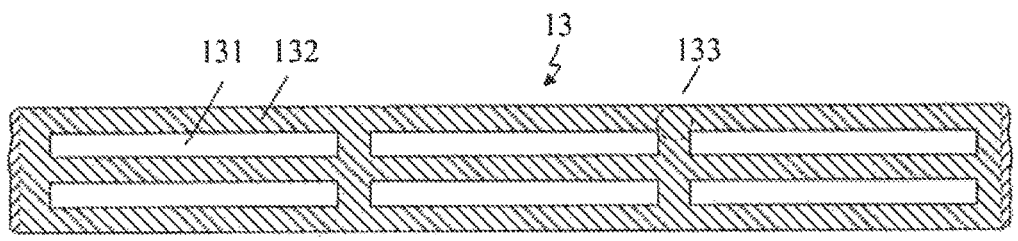
FIGS. 3A-3C are schematic structural top view of a peripheral wire according to an embodiment of the present disclosure.
Figure 3B:
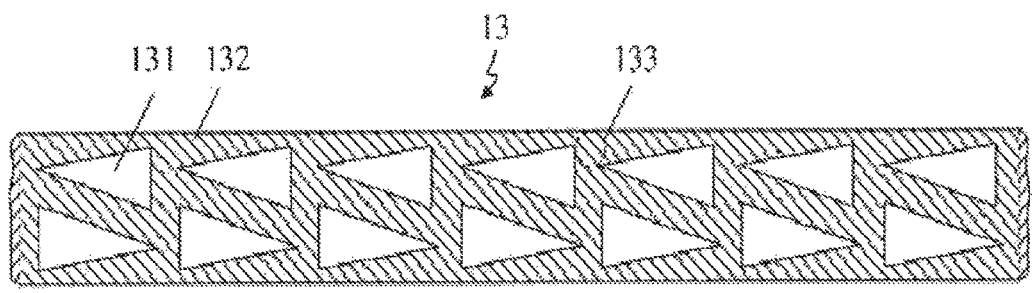
Figure 3C:
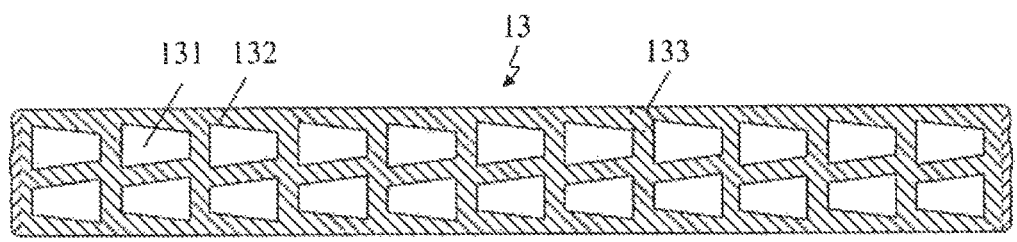

Preferably, a vacancy pattern may be any patterns. In an embodiment of the present disclosure, preferably, the vacancy pattern may be rectangle, triangle or trapezoid. As shown in FIGS. 3A-3C, the peripheral wire 13 includes vacancy patterns 131, which may be any of rectangle, triangle and trapezoid or combination thereof, and a non-vacancy pattern 132. The non-vacancy patterns 132 of the peripheral wire 13 are designed to meet the following requirements. A maximum circle region that the shielding region defined by the adjacent edges of the non-vacancy pattern 132 of the peripheral wire 13 can cover has a maximum diameter of a first threshold. In other words, a maximum circle region that the continuous non-vacancy pattern 132 can shield has a maximum diameter of a first threshold. The first threshold may be considered as the minimum width of the cured frame sealing glue by the diffracted ultraviolet light (it is appreciated that, however, other type of radiation may be used) in the un-cured frame sealing glue. The minimum width W is shown in FIG. 2. It is noted that the vacancy patterns 131 in the peripheral wire 13, as shown in FIGS. 3A-3C, are only illustrated for interpretation. The vacancy patterns 131 may be designed in any shape and to have various area, provided that the maximum diameter of the circle regions that the shielding region defined by the adjacent edges of the non-vacancy patterns of the peripheral wire can shield is the first threshold. Accordingly, the layout of the vacancy patterns 131 may be varied. For purpose of brevity, detailed description about the variation is omitted.

In an embodiment of the present disclosure, the array region preferably includes thin film transistors and the peripheral wires are formed on a metal layer where gate electrodes of the thin film transistors are located. In the embodiment of the present disclosure, the peripheral wires and the gate electrodes are disposed in the same layer so as to simplify the process of manufacturing the array substrate.

The embodiment of the present disclosure has the following advantages: the vacancy patterns in the peripheral wires allow the ultraviolet light to tranverse; the total area of the vacancy patterns is designed as the second threshold and the maximum diameter of the circle regions that the continuous non-vacancy patterns of the peripheral wires can shield is designed as the first threshold such that the ultraviolet light that traverse the vacancy patterns can completely cure the frame sealing glue shielded by the adjacent non-vacancy patterns of the peripheral wires, thereby fully curing the frame sealing glue shielded by the whole peripheral wires; and the peripheral wires have a resistivity in a range from 0 to $2.83 \times 10^{-8}$ $\Omega \cdot m$ such that a resistance of the peripheral wires having the strip-like rectangle vacancy patterns meet requirement for signal transmission.

In order to further illustrate the array substrate, a strip-like rectangle vacancy pattern in an embodiment of the present disclosure is described as an example of the vacancy pattern as below.

Figure 4:
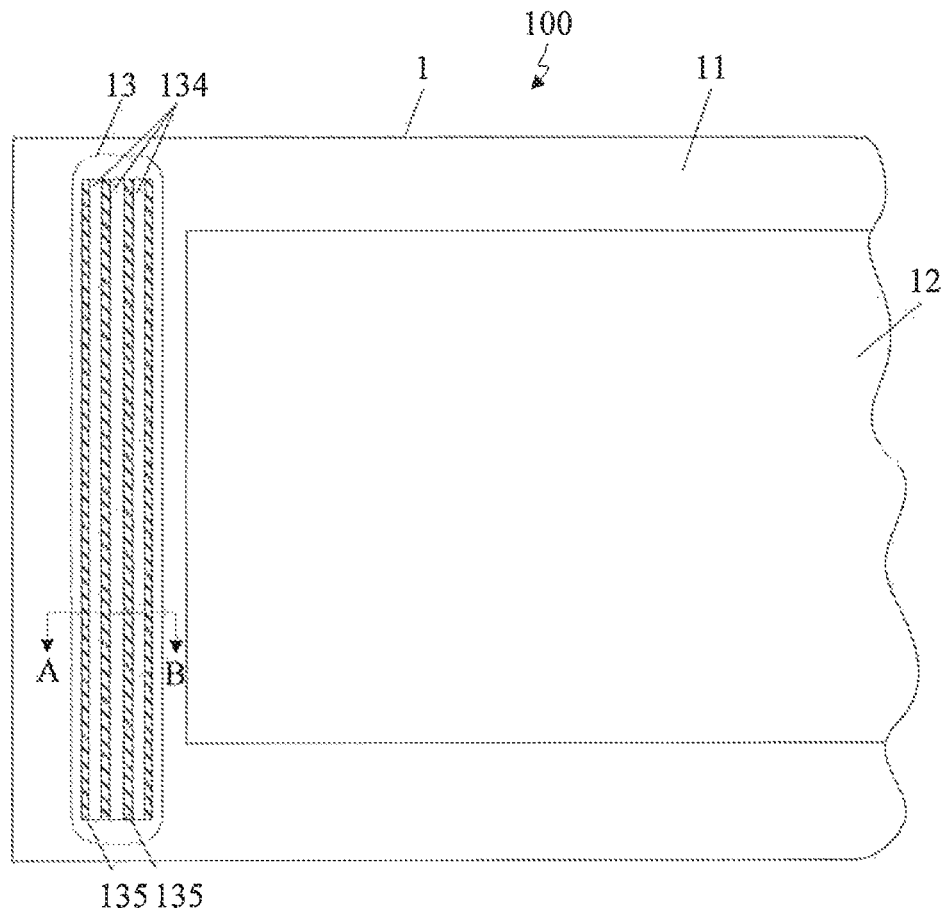
FIG. 4 is a schematic local top view of an array substrate according to an embodiment of the present disclosure.

As shown in FIG. 4, the embodiment of the present disclosure provides an array substrate 100, comprising a substrate 1 and an array region 12 and a peripheral region 11 formed on the substrate 1. A peripheral wire 13 in the peripheral wire region 11 has a plurality of strip-like rectangle vacancy patterns 134. The portions of the peripheral wire between the strip-like rectangle vacancy patterns 134 is illustrate in FIG. 4 as the non-vacancy patterns 135. The total area of the strip-like rectangle vacancy patterns 134 in the peripheral wire 13 is bigger than the second threshold, which is 26%~50% of the area defined by the peripheral wire 13 where the strip-like rectangle vacancy patterns 134 are located.

Figure 5:
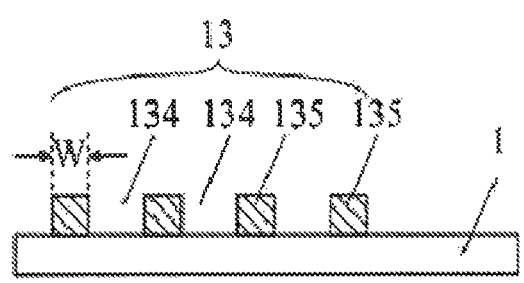
FIG. 5 is a schematic local sectional view of an array substrate according to an embodiment of the present disclosure.

The strip-like rectangle vacancy patterns 134 have, the same extension direction as the peripheral wire 13 and a distance between the adjacent strip-like rectangle vacancy patterns 134 may be less than 55 μm. According to an optimal embodiment of the present disclosure, the distance between the adjacent strip-like rectangle vacancy patterns 134 may be preferably in a range from 45 μm to 50 μm in terms of the resistance of the peripheral wire 13. In the embodiment, the peripheral wire is designed such that the circle regions in the shielded regions that are defined by adjacent edges of the non-vacancy pattern have a maximum diameter as the first threshold, meeting the requirement for signal transmission. FIG. 5 illustrates a schematic sectional view at AB-line of the array substrate 100 in FIG. 4. The non-vacancy patterns 135 between the strip-line rectangle vacancy patterns 134 on the substrate 1 (i.e., a distance between the strip-like rectangle vacancy patterns 134) have a width less than or equal to 55 μm, such as 45 μm, 48 μm or 50 μm.

In the embodiment of the present disclosure, the strip-like rectangle vacancy patterns 134 of the peripheral wire allow the ultraviolet light to traverse and have a spacing less than or equal to 55 μm between adjacent strip-like rectangle vacancy patterns 134, which enable the ultraviolet light to completely cure the frame sealing glue located between the adjacent strip-like rectangle vacancy patterns 134 so as to fully curing the whole frame sealing glue shielded by the peripheral wire 13.

In the embodiment of the present disclosure, the resistance of the peripheral wire 13 may be less than or equal to $2.83 \times 10^{-8} \Omega$. The peripheral wire 13 having a resistance less than or equal to $2.83 \times 10^{-8} \Omega$ enable the strip-like rectangle vacancy patterns 134 to meet the requirement for electrical signal transmission. Preferably, the peripheral wire 13 is made of copper or silver, in which copper has a resistivity of $1.75 \times 10^{-8}$ $\Omega \cdot m$ and silver has a resistivity of $1.65 \times 10^{-8}$ $\Omega \cdot m$. In this instance, the resistance of the peripheral wire 13 still may meet the requirement for signal transmission even though most of the peripheral wire 13 were vacant.

Preferably, the array region 11 includes thin film transistors (not shown) and the peripheral wire 13 is formed in the metal layer where the gate electrodes of the thin film transistors are located. In the embodiment of the present disclosure, the peripheral wire 13 and the gate electrodes are disposed in the same layer so as to simplify the process of manufacturing the array substrate.

The embodiments of the present disclosure have the following advantages: the vacancy patterns in the peripheral wires allow the ultraviolet light to tranverse; the total area of the vacancy patterns is designed as the second threshold and the maximum diameter of the circle regions that the continuous non-vacancy patterns of the peripheral wires can shield is designed as the first threshold such that the ultraviolet light that traverse the vacancy patterns can completely cure the frame sealing glue shielded by the adjacent non-vacancy patterns of the peripheral wires, thereby fully curing the frame sealing glue shielded by the whole peripheral wires; and the peripheral wires have a resistivity in a range from 0 to $2.83 \times 10^{-8}$ $\Omega \cdot m$ such that a resistance of the peripheral wires having the strip-like rectangle vacancy patterns meet requirement for signal transmission.

An embodiment of the present disclosure provides a display panel, comprising the array substrate 100 according to the above embodiments of the present disclosure.

The display panel is illustrated by reference to an exemplary array substrate 100 shown in FIG. 4 as below.

Figure 6:
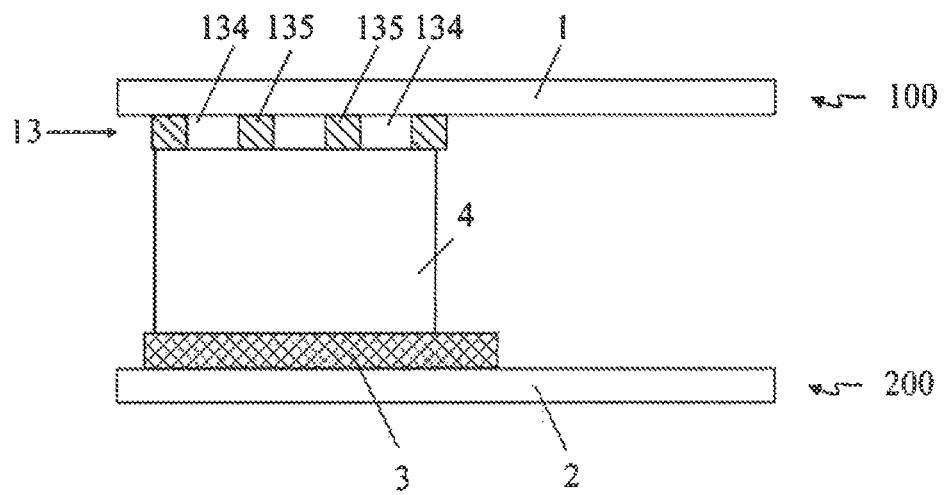
FIG. 6 is a schematic sectional view of a display panel according to an embodiment of the present disclosure, prior to solidification of the frame sealing glue.

As shown in FIG. 6, a schematic sectional view of the display panel prior to solidification of the frame sealing glue is illustrated, in which the display panel includes an array substrate 100 and a color film substrate 200 arranged opposite to each other.

The array substrate 100 includes a substrate 1 and a peripheral wire 13. The peripheral wire 13 has a plurality of strip-like rectangle vacancy patterns 134. The portions between the plurality of strip-like rectangle vacancy patterns 134 are shown as the non-vacancy patterns 135. The strip-like rectangle vacancy patterns 134 of each of the peripheral wires 13 have a total area which is 26%~50% of the area of the peripheral wire. The strip-like rectangle vacancy patterns 134 have the same extension direction as the peripheral wire 13 and a distance between the adjacent strip-like rectangle vacancy patterns 134 may be less than 55 μm. Preferably, the peripheral wires have a resistivity less than or equal to that of aluminium.

According to the embodiment of the present disclosure, the color film substrate 200 may include the substrate 1 and a black matrix 3 formed on the substrate 1.

There is un-cured frame sealing glue 4 located between the array substrate 100 and the color film substrate 200. A part of the peripheral wire 13 on the array substrate 100 is located corresponding to the un-cured frame sealing glue 4, i.e., the peripheral wire 13 shields the un-cured frame sealing glue 4. If the peripheral wire 13 is sufficiently wide, the part of the peripheral wire 13 on the array substrate 100 being located corresponding to the un-cured frame sealing glue 4 may be understood as part of wire of the peripheral wire 13 being located corresponding to the un-cured frame sealing glue 4. The black matrix 3 is disposed a side of the color film substrate 200 that faces to the array substrate 100 and completely shields the un-cured frame sealing glue 4.

Figure 7:
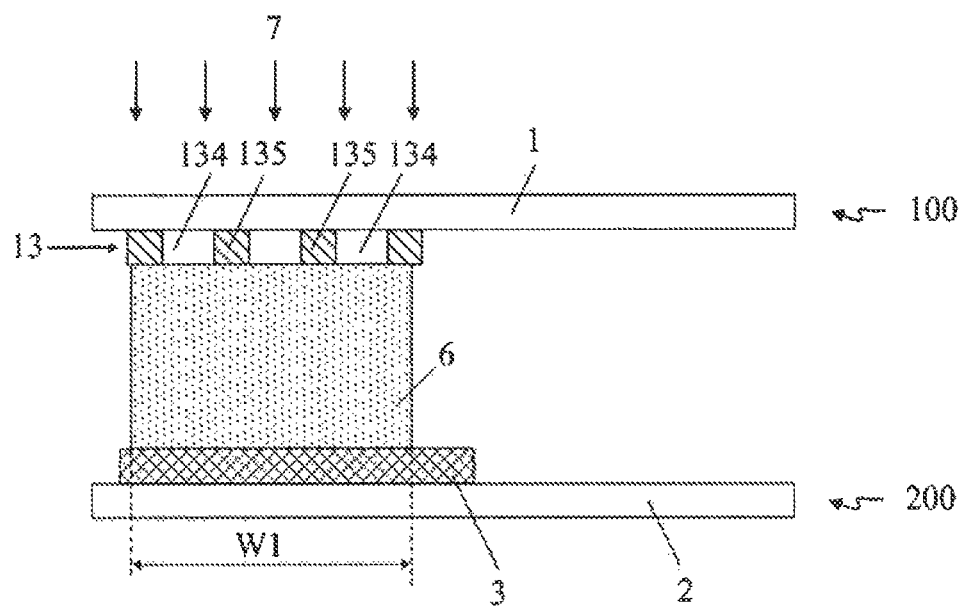
FIG. 7 is a schematic sectional view of a display panel according to an embodiment of the present disclosure, posterior to solidification of the frame sealing glue.

Referring to FIG. 7, a schematic sectional view of the display panel posterior to solidification of the frame sealing glue by the ultraviolet light is illustrated (the reference numbers represent the same components as FIG. 6). In the embodiment, the ultraviolet light 7 traverse the strip-like rectangle vacancy patterns 134 of the peripheral wire 13 so as to completely cure the un-cured frame sealing glue 4 (shown in FIG. 6) as the frame sealing glue 6 as shown in FIG. 7.

Preferably, the above un-cured frame sealing glue 4 or the frame sealing glue 6 have a width in a range from 0.8 mm to 1.2 mm.

In another embodiment of the present disclosure, the vacancy pattern may be triangle or trapezoid and have similar structure, detailed description is omitted here for purpose of brevity.

The embodiments of the present disclosure have the following advantages: the vacancy patterns in the peripheral wires allow the ultraviolet light to tranverse; the total area of the vacancy patterns is designed as the second threshold and the maximum diameter of the circle regions that the continuous non-vacancy patterns of the peripheral wires can shield is designed as the first threshold such that the ultraviolet light that traverse the vacancy patterns can completely cure the frame sealing glue shielded by the adjacent non-vacancy patterns of the peripheral wires, thereby fully curing the frame sealing glue shielded by the whole peripheral wires; and the peripheral wires have a resistivity in a range from 0 to $2.83 \times 10^{-8}$ Ω·m such that a resistance of the peripheral wires having the strip-like rectangle vacancy patterns meet requirement for signal transmission.

An embodiment of the present disclosure provides a display device, comprising the display panel according to the above embodiments of the present disclosure.

The embodiments of the present disclosure have the following advantages: the vacancy patterns in the peripheral wires allow the ultraviolet light to tranverse; the total area of the vacancy patterns is designed as the second threshold and the maximum diameter of the circle regions that the continuous non-vacancy patterns of the peripheral wires can shield is designed as the first threshold such that the ultraviolet light that traverse the vacancy patterns can completely cure the frame sealing glue shielded by the adjacent non-vacancy patterns of the peripheral wires, thereby fully curing the frame sealing glue shielded by the whole peripheral wires; and the peripheral wires have a resistivity in a range from 0 to $2.83 \times 10^{-8}$ Ω·m such that a resistance of the peripheral wires having the strip-like rectangle vacancy patterns meet requirement for signal transmission.

Figure 8:
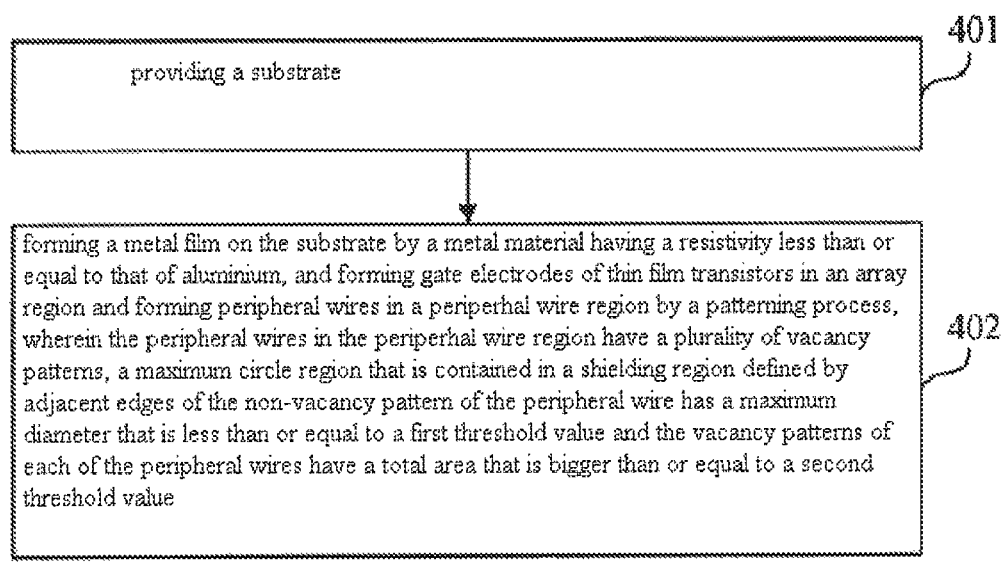
FIG. 8 is a flow chart of a method of manufacturing an array substrate according to an embodiment of the present disclosure.

By referring to FIG. 8, an embodiment of the present disclosure provides a method of manufacturing an array substrate, comprising:

Step 401: providing a substrate;

Step 402: forming a metal film on the substrate by a metal material having a resistivity in a range from 0 to $2.83 \times 10^{-8}$ Ω·m, and forming gate electrodes of thin film transistors in an array region and forming peripheral wires in a peripheral wire region by a patterning process, wherein the peripheral wires in the peripheral wire region have a plurality of vacancy patterns, the maximum circle region that is contained in a shielding region defined by adjacent edges of the non-vacancy pattern of the peripheral wire has a maximum diameter of a first threshold value and the vacancy patterns of each of the peripheral wires have a total area of a second threshold value.

Preferably, the first threshold is in a range from 45 to 55 μm and the second threshold may be 26%~50% of the area of the own peripheral wire where the vacancy patterns are located.

The embodiment of the present disclosure has the following advantages: the vacancy patterns in the peripheral wire allow the ultraviolet light to tranverse; the total area of the vacancy patterns is designed as the second threshold and the maximum diameter of the circle regions that the continuous non-vacancy patterns of the peripheral wire can shield is designed as the first threshold such that the ultraviolet light that traverse the vacancy patterns can completely cure the frame sealing glue shielded by the adjacent non-vacancy patterns of the peripheral wire, thereby fully curing the frame sealing glue shielded by the whole peripheral wire; and the peripheral wires have a resistivity in a range from 0 to $2.83 \times 10^{-8}$ Ω·m such that a resistance of the peripheral wires having the strip-like rectangle vacancy patterns meet requirement for signal transmission.

Although several exemplary embodiments of the present disclosure have been shown and described, it would be appreciated by those skilled in the art that various changes or modifications may be made in these embodiments without departing from the principles and spirit of the present invention, the scope of which is defined in the claims and their equivalents.

The invention claimed is:

1. A method of forming a display device, the method comprising:

providing a substrate and forming an array region and a peripheral wire region on the substrate, wherein peripheral wires in the peripheral wire region each include a plurality of vacancy patterns that permit light to traverse therethrough, and adjacent edges of non-vacancy patterns of the peripheral wires define shielding regions being in a range of 45 μm to 55 μm;

providing a color film substrate;

providing an un-cured frame sealing glue between the substrate and the color filter substrate such that part of the peripheral wire on the substrate is located corresponding to at least part of the un-cured frame sealing glue, the peripheral wire shielding the un-cured frame sealing glue; and providing ultraviolet light to the substrate so as to traverse the vacancy patterns of the peripheral wire, thereby completely curing the un-cured frame sealing glue to cured frame sealing glue so as to bond the substrate and the color filter substrate;

wherein the vacancy patterns of each of the peripheral wires have a total area of a threshold value which is 26%~50% of an area of the peripheral wires themselves where the vacancy patterns are located.

2. The method according to claim 1, wherein the peripheral wires have a resistance in a range from 0 to $2.83 \times 10^{-8}$ $\Omega \cdot m$.

3. The method according to claim 1, wherein the method further comprises:
provising a black matrix on a side of the color film substrate facing the array substrate, the black matrix being located corresponding to the frame sealing glue, the black matrix completely shielding the frame sealing glue.

4. The method according to claim 1, wherein the vacancy patterns each is in a shape of a rectangle, triangle, trapezoid, or combination thereof.

5. The method according to claim 1, wherein the vacancy patterns each is configured as a strip-like rectangle vacancy pattern and each of the peripheral wires has the same extension direction as that of the vacancy patterns therein.

6. The method according to claim 1, wherein the peripheral wires are made of copper or silver.

7. The method according to claim 1, wherein the method further comprises:
providing thin film transistors in the array region such that the peripheral wires are formed in a metal layer where gate electrodes of the thin film transistors are located.

8. The method according to claim 1, wherein the frame sealing glue has a width in a range of 0.8 mm to 1.2 mm.

* * * * *